United States Patent [19]

Jones et al.

[11] 3,984,831
[45] Oct. 5, 1976

[54] TRACKING DIGITAL ANGLE ENCODER
[75] Inventors: Donald H. Jones, Pittsburgh; Robert G. Burig, Allison Park; Paul F. McNally, Gibsonia, all of Pa.
[73] Assignee: Control Systems Research, Inc., Pittsburgh, Pa.
[22] Filed: Dec. 12, 1974
[21] Appl. No.: 532,066

[52] U.S. Cl. ........................... 340/347 SY; 235/186
[51] Int. Cl.² ..................... H03K 13/02; G06G 7/22
[58] Field of Search .............. 340/347 SY; 235/186, 235/189; 318/605

[56] References Cited
UNITED STATES PATENTS

| | | | |
|---|---|---|---|
| 3,335,417 | 8/1967 | Adler et al. | 340/347 SY |
| 3,564,539 | 2/1971 | Dew | 340/347 SY |
| 3,576,986 | 5/1971 | Brickner et al. | 235/189 |
| 3,641,565 | 2/1972 | Ivers et al. | 340/347 SY |
| 3,789,391 | 1/1974 | Brock et al. | 340/347 SY |
| 3,827,045 | 7/1974 | Markus | 340/347 SY |
| 3,872,388 | 3/1975 | James | 340/347 SY X |

*Primary Examiner*—Jerry Smith
*Attorney, Agent, or Firm*—Robert D. Yeager; Howard G. Massung

[57] ABSTRACT

A tracking digital angle encoder utilizing a translator, for providing the difference between an analog angle input and a digital angle input, a counter, which feeds the digital angle input to the translator, a detector, which controls the counter and is connected to the output of the translator to be activated by the output of the translator exceeding a predetermined trigger value, all of which are connected to cause the counter to count to a position where the output of the translator is less than the predetermined trigger level. When the output of the translator is less than the predetermined trigger value, the output of the counter provides a digital signal which closely approximates the analog angle input to the translator. A balanced demodulator which is connected to the output of the translator and receives a signal from a reference oscillator, which is equal to the carrier frequency, provides a pure sine function output representing the difference between the analog and digital inputs to the translator. An adjustment is provided between the counter and the threshold detector which permits the level at which the threshold detector activates the counter to be varied and thus the angle, to which each bit of the counter is equivalent, can be varied. This adjustment allows easy compensation for errors due to mechanical tolerances or mechanical wear in the system being controlled. The translator also provides an output which is equivalent to the cosine of the analog angle input. This cosine output is utilized for switching the counter to its midpoint when the power is first applied if the cosine value is negative, indicating the angular position of the analog signal is in the second or third quadrant.

26 Claims, 7 Drawing Figures

TYPICAL VARIATION OF DEMODULATOR ERROR SIGNAL WITH POSITION

TRACKING DIGITAL ANGLE ENCODER

CROSS REFERENCE TO RELATED APPLICATIONS

This application is related to copending U.S. Pat. application Ser. No. 539,265 filed Jan. 8, 1975 entitled "SERVO SYSTEM EMPLOYING A DIGITAL ANGLE ENCODER" and copending U.S. Pat. application Ser. No. 529,701 filed Dec. 5, 1974 entitled "SOLID STATE TRANSLATOR".

BACKGROUND OF THE INVENTION

1. Field of the Invention

This invention relates to a digital angle encoder and more particularly to a tracking digital angle encoder which utilizes a resolver, a translator, a threshold detector and a counter.

2. Description of the Prior Art

Prior art digital angle encoders utilize multiple gear discs in an arrangement where each disc is read by a device such as a light emitting diode and a phototransistor arrangement. Experience has shown in many industrial applications that vibration and handling of prior art encoders has caused substantial maintenance and down time. Prior art digital angle encoders also are capable of only providing a discrete indication of the shaft position. That is, they cannot indicate the shaft position continuously over its entire rotation with essentially infinite resolution.

An absolute digital position encoder cannot provide a continuous indication of the shaft position. That is, the prior art digital encoders must necessarily break the shaft position down into a discrete number of intervals or angles. Once selected, the size of these intervals or angles cannot be adjusted, and also, the movement or position of the shaft within each discrete interval is indeterminable. Since the interval or angle cannot be adjusted, the digital counts corresponding to a given rotation are fixed. Whenever the term resolver is utilized herein, it is understood to mean resolver, synchro, differential transformer, control transformer or any other sinusoidal position indicating device. The output of resolvers are normally in suppressed carrier form, but it is customary to discuss the output as representing the cosine and sine of selected analog angles. Whenever sine and cosine functions are discussed herein, it is to be understood that these can represent signals in absolute or suppressed carrier form.

U.S. Pat. No. 3,609,320 describes a digital measuring system whereby the position of a movable member is measured utilizing a multiple counter technique which develops sine and cosine signals in Pulse Width Modulated form for application to a trigonometric type angle transducer. An error signal is generated by the transducer to control various logic subsystems that direct the counting of certain counters. The system uses a position measuring device having a plurality of operating cycles for generating an error signal as a function of the position of the movable member relative to the workpiece.

U.S. Pat. No. 3,686,487 also describes a digital measuring system that employs trigonometric signal generators. The system includes a digital to analog converter method to generate two or more analog output signals as a function of a digital input. The analog outputs which are Pulse Width Modulated rectangular waveforms include a fundamental sinusoidal frequency component having an amplitude proportional to a trigonometric function of the digital input. The analog outputs are typically connected as inputs to a position measuring device to trigonometrically define the position between two members of the position measuring transducer.

Like U.S. Pat. No. 3,609,320, the system of the 3,686,487 patent employs the position measuring device as an angle receiver, accepting Pulse Width Modulated signals derived from the array of electronic circuits.

SUMMARY OF THE INVENTION

A tracking digital angle encoder is provided which utilizes a translator, for providing the difference between an analog position input and a digital position input, and a detector which controls a counter providing the digital position input to the translator so that the digital input is counted to a position where the output of the translator is held to a predetermined small value. Thus, the digital position input is equal to the analog position input, with at most a difference error of one digital count. That is, the digital output of the BCD counter represents a position which is within one of the least significant bits (LSB) to the absolute position represented by the analog input. The detector activates either of two gates permitting clock pulses to pass to the appropriate input of the up/down counter so that the digital output of the counter follows the analog input to the translator. The frequency of the clock pulse can, if desired, be made dependent on the difference between the digital output of the counter and the analog input to the translator. That is, the clock frequency can be varied in steps or continuously as the output of the digital counter approaches the analog input to the translator.

The analog input to the translator can be in sine, cosine form from a resolver, in which case the digital angle output of the counter will follow or track the position of the resolver. The output of the resolver can be in suppressed carrier form and the analog output of the translator will also be in suppressed carrier form. The output of the translator can be fed to a balance demodulator whose excitation is the same as the carrier and the envelope of the demodulated signal is actually proportional to the difference between the analog and digital inputs to the translator. Using this analog error signal, a continuous tracking resolver to digital angle converter can be constructed.

The detector can also be interconnected with the output of the reference oscillator which feeds the resolver, so that any variation in the resolver output due to the oscillator will be compensated for.

The demodulated error signal is fed to a double ended threshold detector whose upper and lower thresholds are set at equivalent DC levels of plus ½ of the value of the least significant bit (LSB) and minus ½ of the value of the least significant bit (LSB). For example, if a 360° circle is divided into a thousand parts, where each part is equivalent to .36°, the threshold detector would be set at values approximately equivalent to +.18° and −.18°. In practice the threshold levels are set at equivalent DC levels of slightly greater than plus ½ LSB and slightly more negative than minus ½ LSB, to guarantee stability. Hereafter the threshold levels will be referred to as plus ½ LSB or minus ½LSB, or their angular equivalents, for convenience. Whenever the output of the translator is greater than +.18°, the upper threshold of the detector will activate a gate enabling the binary coded decimal (BCD) up/down counter to count up. Similarly, whenever the output of the translator is less than −.18°, the lower threshold detector will enable the up/down counter to count down. When the output of the translator is between values equivalent to +.18° and −.18°, the clock pulses to the up/down counter are inhibited and the counter indicates approximately the digital equivalent of the analog angular input to the translator. The tendency of the counter is to reach a steady state with a minimum error signal. In the disclosed tracking digital angle encoder, the counter output reaches a steady state when the demodulated error signal drops to a value within ± ½ of the least significant bit. Steady state output of the digital counter, which is in binary coded decimal form, corresponds to the analog angular input within an angle equivalent to the value of the least significant bit.

If the resolver shaft is rotated to a new position, the threshold detector instantaneously will enable the clock pulses to move the counter output in the right direction until the error signal drops to within essentially plus or minus ½ of the least significant bit; and, the counter output will settle to a new steady state value equal to the BCD equivalent of the new resolver angular position. The tracking nature of the converter can easily be understood from the above information. To keep the settling time for the counter small, a high clock frequency must be used. As explained above, the clock frequency can be varied as the settling or null point is approached.

The teaching of U.S. Pat. No. 3,609,320 can be contrasted with the system described in the instant application which does not utilize the position measuring device for the generation of the error signal, but incorporates an angle translator which generates the position error signal as a function of the absolute angular input from the position measuring device and an absolute digital input which is generated by the internal circuitry.

Furthermore, the instant application discloses a system that measures the absolute position of a mechanism and teaches the use of a plurality of such systems that can be employed to measure the absolute position over multiple revolutions or electrical cycles of any one of the measurement transducers.

The advantage of measuring the absolute position over the full range of travel is obvious, since with an absolute system the readout of position is always exact even if the mechanism to be measured is moved while the power to the electronic measuring system is removed and then reapplied. For the incremental system described in U.S. Pat. No. 3,609,320, removal of power will cause the counters to lose their memory and therefore not be able to indicate exact position when the power is reapplied.

A device constructed according to the teaching of the invention of the instant application incorporates a novel translator and associated circuits that do not require the generation of two precise analog outputs. Instead, the translator accepts the analog outputs of the position measuring device directly and incorporates only one counter to provide a digital output representative of the position of the measuring device. Furthermore, additional novel techniques have been added to vary the equivalency between the output of the position measuring device and the digital output of the system which can be varied either from an external signal or as a predetermined function of the digital output.

Prior art tracking digital angle encoders cannot differentiate between any two positions of the resolver which are 180° apart when power is initially turned on. To overcome this difficulty the resolver output corresponding to the minus cosine of the analog angular input is demodulated and used for switching the counter to its midpoint when power is applied and the cosine value is negative. Since the cosine of the analog angular input is negative for analog angles between 90° and 270° this factor is utilized to preset the counter to its midpoint, which for a thousand count counter would be 500, whenever the resolver shaft is setting at an angle between 90° and 270°, and to 000 otherwise. As soon as the counter is set, when power is applied, the tracking action of the digital angle encoder takes over and the counter output settles to the correct value within approximately plus or minus ½ of the least significant bit. Utilizing the cosine to position the counter at either 0 or its midpoint when power is applied reduces the time required for the counter to indicate the position of the resolver.

The disclosed tracking digital angle encoder also utilizes an adjustment disposed between the detector and the counter output, which permits the threshold level at which the detector activates to be varied. This adjustment allows the number of counts corresponding to full rotation of the resolver input shaft to be varied. That is, each count of the counter corresponds to a known angular rotation of the resolver shaft; by adjusting the level of threshold detector the value of the angle to which each bit of the counter corresponds can be varied. This option allows for errors due to mechanical tolerances, mechanical wear, or nonuniform mechanical adaptions to be easily corrected.

The threshold detector levels can be derived from the reference oscillator, by a rectifying circuit which sets the fundamental threshold levels as a function of the amplitude of the reference oscillator. Thus, if the reference oscillator amplitude changes, the threshold detector levels will automatically change accordingly. This prevents changes in the amplitude of the reference oscillator from affecting the output of the digital counter. Signals can be added at various points in the encoder circuit to vary the output of the digital counter or to vary the detector levels. This can be useful for rejecting unwanted signals or to compensate for linear or non-linear errors.

It is an object of this invention to provide a digital angle encoding system that also includes an analog output, with essentially infinite resolution, proportional to shaft movement over any section of the shaft rotation.

It is an object of this invention to provide a tracking digital angle encoder which utilizes a resolver which provides a continuous analog angular output, a translator, a detector and a counter.

It is a further object of this invention to provide a tracking digital angle encoder wherein the angular value represented by each count of the digital counter can be varied.

It is a still further object of this invention to provide a tracking digital angle encoder which positions the counter at 0 when the angular position of the shaft is in the first or fourth quadrant and positions the counter at its midpoint when the angular position of the shaft is in the second or third quadrant.

BRIEF DESCRIPTION OF THE DRAWINGS

For a better understanding of the invention, reference may be had to the preferred embodiments exemplary of the invention shown in the accompanying drawings in which.

DESCRIPTION OF THE PREFERRED EMBODIMENTS

Figure 1:
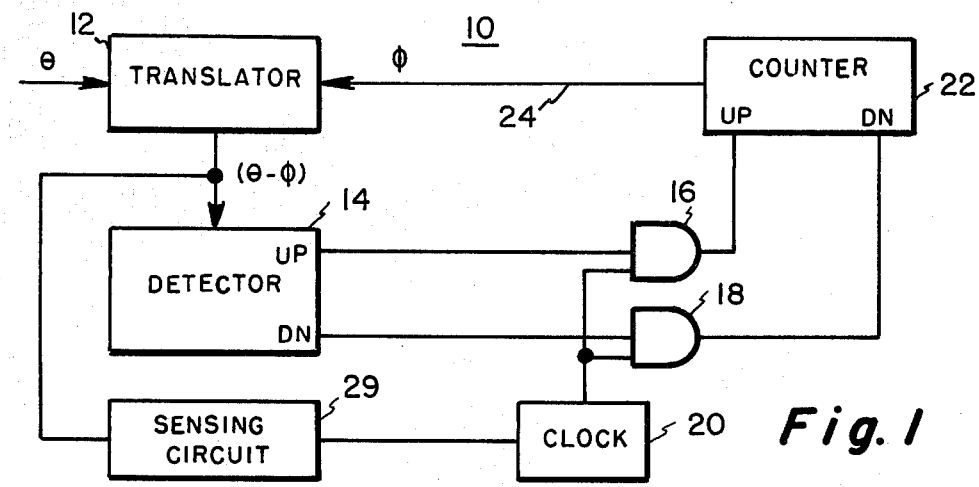
FIG. 1 is a diagram of an analog to digital angle encoder utilizing the teaching of the present invention.
Figure 2:
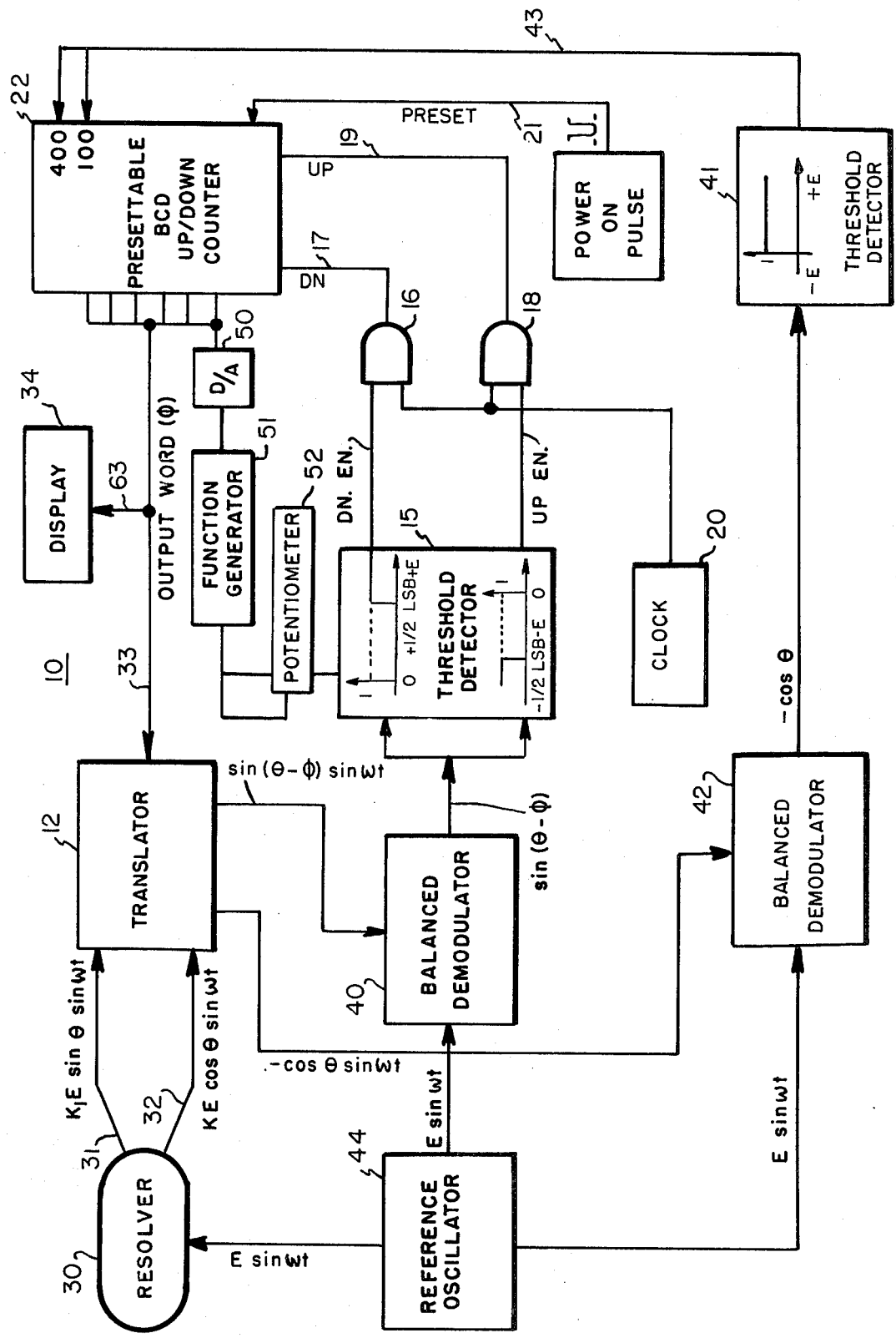
FIG. 2 is a block diagram of a tracking digital angle encoder utilizing the teaching of the present invention.

Referring now to the drawings and FIGS. 1 and 2 in particular, there is shown a digital angle encoder 10 utilizing the teaching of the present invention. As is shown in FIG. 1 an analog signal $\theta$, which represents a position, is fed to one input of a translator 12, while a digital signal $\phi$ is fed to another input of translator 12. Translator 12 provides an output $(\theta - \phi)$ which is equivalent to the difference between its inputs. This difference $(\theta - \phi)$ is fed to a detector 14 which determines if the $(\theta - \phi)$ error signal is positive or negative and activates appropriate AND gate 16 or 18 so that a clock 20 can activate counter 22 to reduce the error signal $(\theta - \phi)$ to within a predetermined value. That is, counter 22 counts so that $(\theta - \phi)$ at steady state it is within one count of the least significant bit to $\phi$. For example, for a one thousand count counter, each count is equal to .36° and the digital output $\phi$ of counter 22 will be within .36° of the analog input $\theta$. That is, if every indication $\phi$ of counter 22 is viewed as representing an absolute point, then the analog input $\theta$ is within plus or minus ½ of the least significant bit to that point. For a one thousand count counter then, the analog signal $\theta$ is within .18° of an absolute point, which in realty, is the midpoint of the range defined by the counter indication $\phi$. Detector 14 is constructed so that whenever $(\theta - \phi)$ is greater than plus .18° by a small amount, the detector 14 will activate AND gate 16 to enable up/down counter 22 to count up, increasing $\phi$, in response to pulses from clock 20. Similarly whenever $(\theta - \phi)$ is less than $-.18°$ by a small amount, the lower threshold AND gate 18 will be activated enabling the counter 22 to count down, decreasing $\phi$, in response to pulses from clock 20. However, when the absolute value of $(\theta - \phi)$ is less than .18° both the up and down gates 16 and 18, respectively, are disabled and clock pulses are not fed to the counter. Whenever the error signal is positive, the counter counts up. Similarly whenever the error signal is negative, the counter counts down. The output of the counter, which is normally in binary coded decimal form (BCD), is fed back to the translator 12 along line 24. In essence, this is a closed loop feedback control system. The disclosed system is an electronic servo, wherein the digital output of counter 22 follows the analog input to translator 12. The tendency of the system is to reach a steady state with minimum error signal. If the analog input angle $\theta$ is arbitrarily changed to a new position, detector 14 instantly will enable the proper AND gate 16 or 18 to clock the counter in the right direction until the error signal $(\theta - \phi)$ drops to within the range plus or minus ½ of the least significant bit (LSB) and the counter output 22 will settle to a new steady state value equal to the best BCD equivalent of the new analog indication.

The disclosed analog to digital angle encoder 10 preferably utilizes a solid state translator as described in more detail in copending U.S. Pat. application Ser. No. 529,701. Translator 12 can best be described as a hybrid computer which performs the computation of the function sin $(\theta - \phi)$; where $\theta$ is the angular position of a resolver 30 and $\phi$ is the angle of the counter 22.

Referring now to FIG. 2, there is shown a tracking digital angle encoder 10 utilizing the teaching of the present invention. Translator 12 is fed an analog signal $\theta$ which is in suppressed carrier sine, cosine form. A resolver 30 provides a signal $K_1 E \sin \theta \sin \omega t$ on line 31 and the signal $K_1 E \cos \theta \sin \omega t$ on line 32 which are fed to translator 12. Sin $\omega t$ is a carrier the magnitude of whose envelope provides the desired information. Another input, in digital or in binary coded decimal (BCD) form, is provided to the translator 12 from counter 22 along line 33. If desired, an optical display 34 of the output of digital counter 22 can be provided. The output 34 is controlled by the position of the shaft of resolver 30 as will be hereinafter described in detail. The output of display 34 is the digital equivalent of the analog input to translator 12. Thus the output of the display 34 provides a visual indication of the position of the resolver shaft 30. Translator 12 provides an output equal to sin $(\theta - \phi) \sin \omega t$. The analog function sin $(\theta - \phi) \sin \omega t$ is generated by performing certain trigonometric manipulations on the resolver output signals sin $\theta \sin \omega t$ and cos $\theta \sin \omega t$ and is based on the following identity:

sin $(\theta - \phi)$ = (sin $\theta$ − cos $\theta$ tan $\phi$)·cos $\phi$. The programmed angle $\phi$ is usually available as a 12-bit BCD (3 decade) word. With the addition of a few other building blocks, a continuous tracking resolver to digital angle encoder can be constructed. For a thousand count counter, the digital angle encoder will have a range of 0 to 999 plus or minus ½ LSB (0° − 359.64 plus or minus .18°). The output of the translator 12 is an amplitude modulated sine wave proportional to sin $(\theta - \phi) \sin \omega t$. This output signal is fed to a balanced demodulator whose excitation is the same as the carrier E sin $\omega t$. The output of the demodulator is proportional to sin $(\theta - \phi)$, with the carrier removed. This represents the differential error between the resolver angular position $\theta$ and the digital position $\phi$ from counter 22. When $\theta$ is approximately equal to $\phi$, then sin $(\theta - \phi)$ is approximately equal to $(\theta - \phi)$. Demodulated error signal sin $(\theta - \phi)$ is fed to a double ended threshold detector 15 whose upper and lower threshold limits are set at essentially DC levels of +½ LSB and −½ LSB, respectively. Expressed in degrees, the threshold levels are equivalent to +.18° and −.18°, for a one thousand count counter. Whenever $(\theta - \phi)$ is greater than +.18° the upper threshold detector will switch and enable preset BCD up/down counter 22 to count up. Similarly, whenever $(\theta - \phi)$ is less than −.18°, the lower threshold detector will enable the counter 22 to count down. However, when absolute value $(\theta - \phi)$ is less than .18°, both the up and down counter lines 17 and 19, respectively, are disabled and the clock pulses are inhibited to the counter 22. The phasing of the demodulator is such that whenever the error signal is positive the counter counts up. Similarly when the error signal is negative, it counts down. Counter output word $\phi$ is coupled back to translator 12. The tendency of the system is to reach a steady state with minimum error signal. In the disclosed system the counter output reaches a steady state when the demodulated error signal drops down to a value within plus or minus ½ LSB. In the steady state the counter output word $\phi$ will be the BCD number corresponding to $\theta$ within plus or minus ½ LSB.

If the resolver 30 shaft is arbitrarily rotated to a new position, the threshold detector 14 instantaneously will enable the clock pulses to clock the counter 22 in the proper direction, until the error signal drops to within plus or minus ½ LSB and the counter 22 output will settle to a new steady state value equal to the BCD equivalent of the new resolver 30 angular position. From the above explanation, it can be easily seen that when the resolver 30 is rotated to a new position, the digital output of the counter 22 will follow; thus the tracking nature of the system is obvious.

To keep the settling time, that is the time for the counter 22 output digital word to settle to a new value after a change in the resolver 30 shaft position, small, a high clock frequency is used. The period of the clock cycle, however, should be sufficiently greater than the turn on time for the solid state analog switches utilizes in the system. For the tracking digital angle encoder shown in FIG. 2 a clock frequency of 100 KHz is used. The frequency of clock 20 can vary as the new settling position is approached. The variation can be continuous or in discrete steps. The output of translator 12 ($\theta - \phi$) can be sensed, and as this changes the frequency of clock 20 can be varied. When the error signal ($\theta - \phi$) is within a predetermined separation, equivalent to say 3 counts of counter 22, the frequency of clock 20 can be switched to a new frequency such as 10 KHz. This permits rapid settling of the encoder 10 with no overshoot or stability problems. A sensing circuit 29 is provided connected between the output of translator 12 and clock 20 to adjust clock 20 frequency as the error signal ($\theta - \phi$) changes. A step change or a continuous change of frequency can be used.

Most of the prior art tracking type digital angle encoders cannot differentiate between any two positions of the resolver shaft which are 180° apart, whenever power is turned on. To overcome this difficulty, the disclosed system utilizes the cos $\theta$ sin $\omega t$ output of the translator 12. The resolver output corresponding to minus cos $\theta$ sin $\omega t$ is demodulated in a second demodulator 42 which provides an output proportional to minus cos $\theta$. Since cos $\theta$ is negative for $\theta$ in the second and third quadrants, that is between 90° and 270°, this can be utilized at turn on to preset the counter 22 to a preselected midpoint value, such as 500 for a thousand count counter. Thus, whenever the resolver shaft is setting at an angle between 90° and 270°, the counter is set at 500 when power is first applied and for a resolver shaft at an angle of 270° to +90°, the counter is preset at 000. A power on pulse along line 21 sets counter 22 to 000 when power is applied and cos $\theta$ is positive; and when power is applied and cos $\theta$ is negative, a pulse through detector 41 along line 43 sets counter 22 to 500. After the counter is initially preset, the tracking action of the system 10 takes over and the counter output settles to the digital value indicating the position of the resolver shaft 30 within plus or minus ½ LSB. Reference oscillator 44 provides the carrier frequency signal E sin $\omega t$ to resolver 30 and also to demodulators 40 and 42.

For a thousand count counter each count corresponds to a selected .36° range; that is, the threshold detector in this case is set so that the output of balanced demodulator 40 can vary over a range of .36° without causing the counter to count one pulse. A digital to analog converter 50 and a potentiometer 52 feedback loop are provided from the counter 22 to the threshold detector 15 for varying the level at which the threshold detector 15 enables gate 16 or 18 to activate the counter 22. That is, potentiometer 52 provides for adjustment of the threshold level of detector 15. This adjustment permits the angular equivalent value of each count of counter 22 to be varied. For instance, with the variable feedback loop through D/A converter 50 and potentiometer 52, counter 22 can be adjusted so that more or less pulses indicate full revolution of the shaft of resolver 30. For example, this adjustment permits a 950 count to represent full rotation of the shaft of resolver 30. Or alternatively, 1050 counts could represent full revolution of resolver 30 shaft. This effectively changes the value for one count of the counter 22. If the circuit is adjusted so that say a full revolution of resolver 30 shaft is indicated by 990 counts, each count of the counter is equivalent to being increased by slightly greater than 1% over those for a normal thousand bit count and are equal to .3636+°. This adjustment allows for correction of mechanical errors or mechanical differences in activating resolvers 30. The adjustment loop comprising D/A converter 50 and potentiometer 52 allows the revolution of the system to be precisely set over a predetermined range of full scale. This position correction allows errors due to mechanical tolerances or mechanical wear to be easily corrected. With the proper input signal, the feedback adjustment can also be used to correct for nonlinear position variations. A function generator 51 can be used in the controlling connection to detector 15 to vary or impose a signal on the levels of detector 15.

Figure 7:
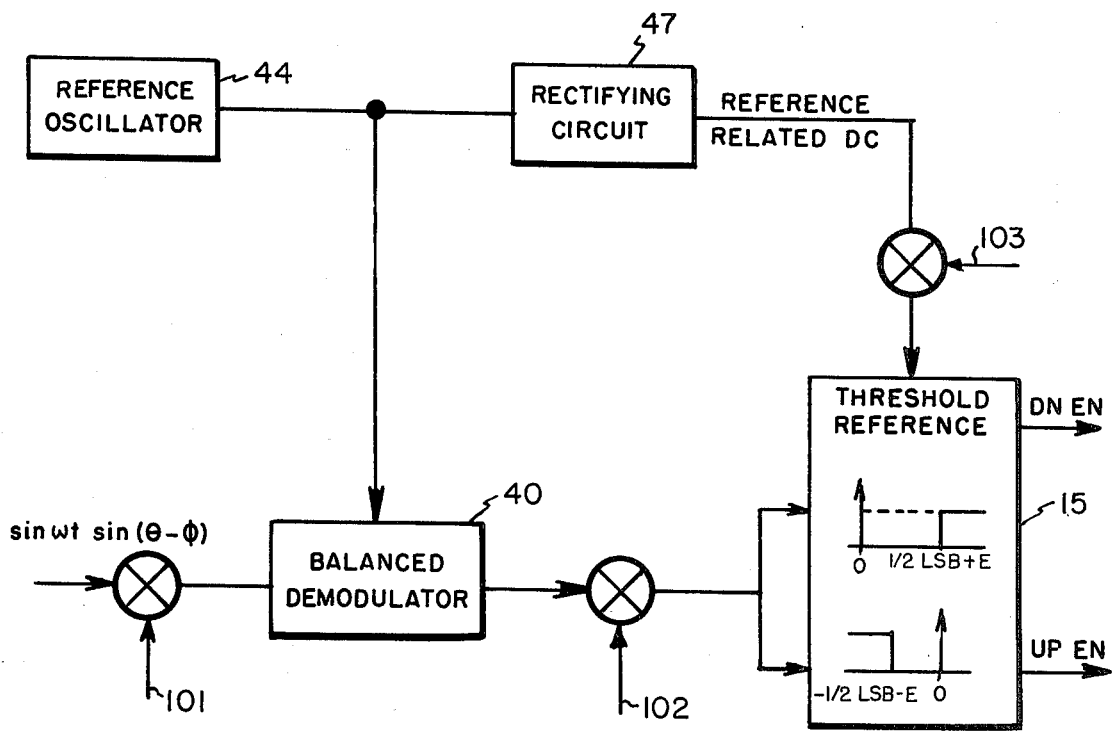
FIG. 7 is a preferred embodiment of a portion of the encoder circuit shown in FIG. 2.

FIG. 7 illustrates a portion of the encoder circuit 10 shown in FIG. 2, including a DC reference supplied to the threshold detector 15 by a rectifying circuit 47 from the reference oscillator 44. In a tracking digital angle encoder as shown in FIG. 2, the amplitude of the signal, sin ($\theta - \phi$), fed to the threshold detector 15 is determined by: (a) reference oscillator 44 amplitude; (b) resolver 30 transmission ratio; (c) translator 12 transmission ratio; and (d) the gain of balanced demodulator 40. The final amplitude of sin ($\theta - \phi$), which is dependent on the above listed factors, determines the level at which threshold detector 15 levels must be set. Without supplying the threshold detector 15 with a DC reference which is related to the amplitude of the reference oscillator 44, it would be necessary to have a reference oscillator with very stable amplitude for proper operation. Otherwise it would be necessary to adjust the detector 15 or oscillator 44 for every variation in the amplitude of oscillator 44. A translator 12 without compensation for oscillator 44 amplitude variation would be subject to variations due to aging and environmental conditions and might require frequent readjustments. A highly stable reference oscillator 44 would also be required. In the circuit shown in FIG. 7 the threshold detector levels are derived from the oscillator reference 44 by a rectifying circuit 47, which establishes the fundamental threshold levels as a function of the amplitude of the output of reference oscillator 44. Therefore, when the amplitude of the reference oscillator 44 changes, the fundamental threshold detector 15 levels are automatically changed to the proper levels.

FIG. 7 also shows three possible input lines 101, 102 and 103 which can be used for varying operation of threshold detector 15. A signal can be applied to the fundamental threshold detector levels via line 103. The signal applied on line 103 could be a signal related to the reference oscillator 44 in such a manner as to alter the absolute value of the fundamental threshold levels in synchronism with the reference oscillator so as to reject unwanted or quadrature signals and thereby enhance the performance of encoder 10.

Lines 101 and 102 can be used for adjusting encoder 10 by adding an AC carrier modulated signal to the term $\sin \omega t \sin (\theta - \phi)$, along line 101, before the balanced demodulator 40 or a DC signal to the term $\sin (\theta - \phi)$, along line 102, after the balanced demodulator 40. Signals added at these lines 101, 102 and 103 could be externally supplied or derived from the counter output through a D/A converter 50 and function generator 51. The signals supplied can compensate for linear or nonlinear errors or cause the encoder 10 to generate linear or non-linear position functions. FIG. 7 thus shows means by which the encoder 10 can be adjusted or its performance enhanced by either adjusting the threshold detector or adding signals to the primary function $\sin (\theta - \phi)$. Also shown are means by which the encoder 10 is made insensitive to variations in the amplitude of the reference oscillator 44, to quadrature signals, or other unwanted signals.

Figure 6:
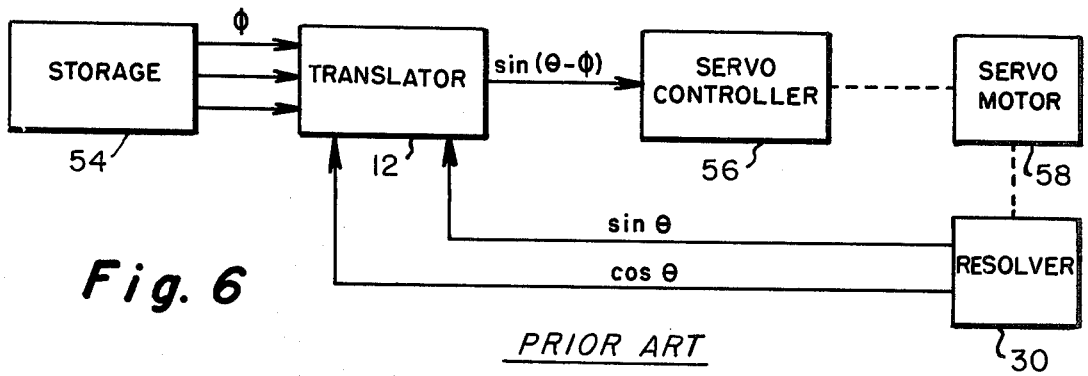
FIG. 6 is a block diagram of a prior art servo positioning system.

Referring now to FIG. 6, there is shown a prior art servo system. A digital command signal $\phi$ is fed from the digital storage unit 54 to translator 12. Translator 12 is supplied with input signals in sine and cosine form indicating the position $\theta$ of a resolver 30. The output of the translator 12 is the difference between the analog input $\theta$ and digital input $\phi$ and is equal to $\sin (\theta - \phi)$. This is fed to a servo controller 56 which activates a servo motor 58 to move a shaft (not shown) to which resolver 30 is connected, so that the error signal output of translator 12 $\sin (\theta - \phi)$ is a minimum. The problem with this construction is that there is no indication of the shaft location when digital input angle $\phi$ is changed.

Figure 3:
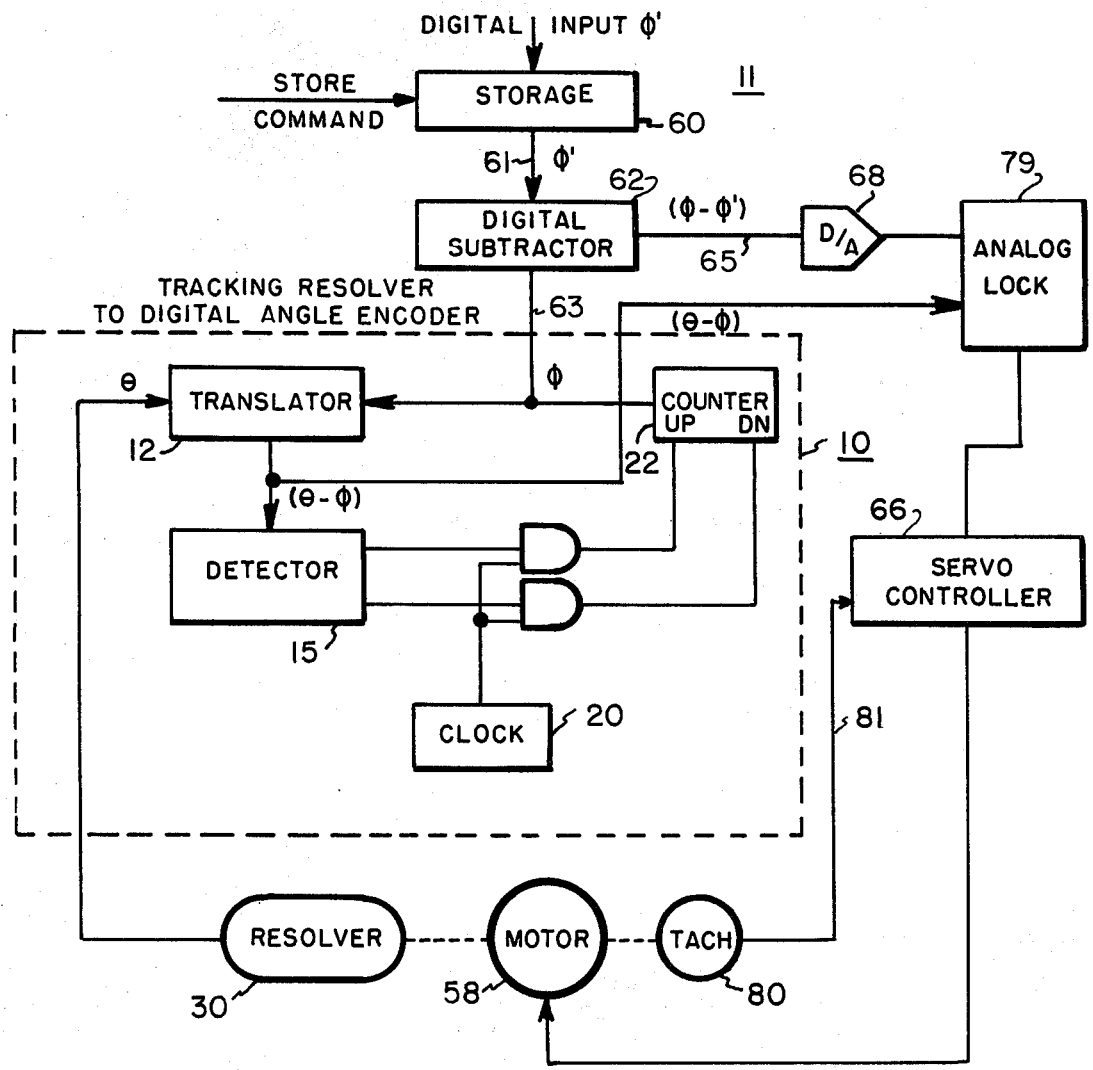
FIG. 3 is a block diagram of an absolute positioning servo system utilizing the digital angle encoder shown in FIG. 1.
Figure 4:
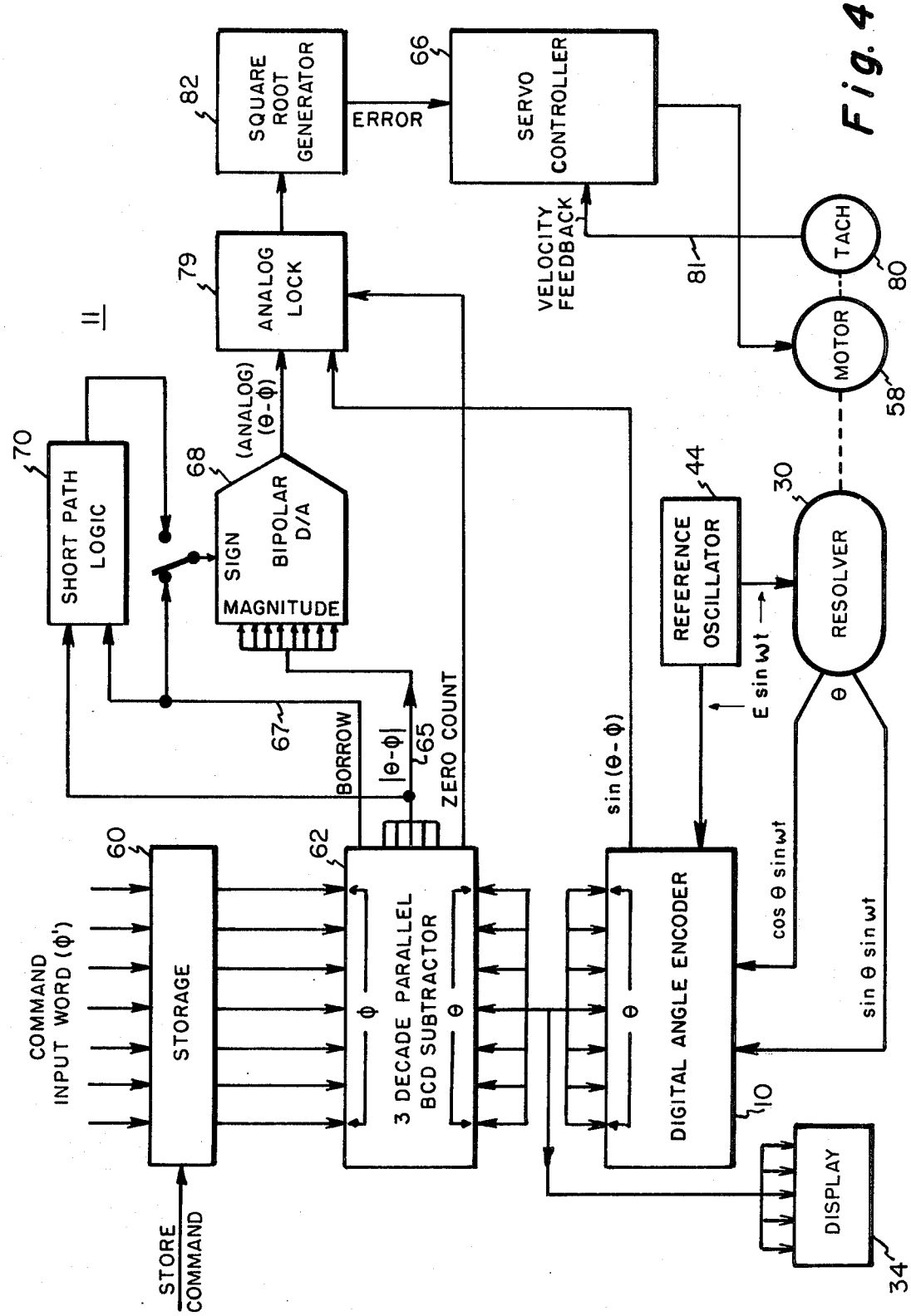
FIG. 4 is a diagram of an absolute positioning servo system utilizing the digital angle encoder illustrated in FIG. 2.

Referring now to FIGS. 3 and 4, there is shown an absolute positioning servo system built in accordance with the teaching of the present invention. This system incorporates the use of either a single speed or a two speed resolver feedback element, combined with a solid state digital translator, as described more fully in U.S. Pat. application Ser. No. 529,701. The translator 12 is connected as a digital encoder, as described previously, that provides BCD output over a predetermined range. The use of an absolute position resolver 30 for the feedback arrangement is substantially superior to that of a digital encoder, due to the inherent reliability associated with resolvers. The resolver 30 utilized requires no alignment, and incorporates no contact elements to wear or cause maintenance problems. The preferred resolver 30 incorporates a brushless rotary transformer, thus eliminating slip rings or brushes. In contrast to a conventional absolute digital encoder system which uses multiple gear discs in an arrangement where each disc is read by a light source diode and a photodetector arrangement, the inherent superior reliability of the disclosed resolver position control system is apparent. Experience has shown in many industrial applications that vibration and handling of conventional encoders has caused substantial maintenance and down time.

Servo control system 11, shown in FIGS. 3 and 4, utilizes the tracking digital angle encoder 10, as shown in FIGS. 1 and 2, to provide an absolute positioning servo system. To build an absolute positioning servo system it is necessary that the position transducer transmits positional information correctly even when power is temporarily interrupted and later restored. The disclosed tracking digital angle encoder 10 qualifies as an absolute digital position transmitter, since it will accurately provide a digital indication of the resolver shaft position even after temporary power interruption. A temporary digital storage register 60 is provided for storing the digital input command signal $\phi'$. The temporary digital storage register 60 stores and provides digital output signals along line 61 which are equal to the digital command input signal $\phi'$. As explained previously, the tracking digital angle encoder 10 provides a digital output signal $\phi$, in BCD form, which represents the position of the shaft of resolver 30. $\phi$, which is the output of counter 22, is transmitted along line 63 to a digital display output 34, shown in FIG. 2, and to a digital subtractor 62. Digital subtractor 62 is provided for sensing a differential error $(\phi - \phi')$ between the actual shaft position $\phi$ and the command shaft position $\phi'$. The parallel BCD subtractor 62, of appropriate length, is used as a calculator of the digital difference error $(\phi - \phi')$ after receiving the $\phi'$ signal along line 61 and the $\phi$ signal along line 63. Digital subtractor 62 provides the differential error signal $(\phi - \phi')$ along line 65. Since the servo system can be operated by an analog voltage input the differential error signal $(\phi - \phi')$ is transformed into an analog voltage form before being fed to the servo controller 66. The conversion of the digital error signal $(\phi - \phi')$ to an analog error signal is accomplished by a digital to analog converter 68. This provides an analog signal that is fed to servo controller 66, which in turn activates motor 58 to move the shaft which resolver 30 is instrumenting to a position wherein $\phi = \phi'$. That is, the feedback control system of the absolute positioning servo system 11 is set up so that resolver 30 shaft is moved to position wherein the digital differential error signal $(\phi - \phi) = 0$. The bipolar D/A converter, shown in FIG. 4, actually comprises a unipolar D/A converter followed by a buffer amplifier which is switched from a noninverting to an inverting mode by the borrow output of subtractor 62 along line 67. Digital subtractor 62 performs the fundamental servo function of comparing the command position $\phi'$ to the feedback position $\phi$, and produces a corresponding error signal. Since the tracking digital angle encoder digitizes the resolver feedback in order to provide absolute digital position readout capability, position translator 12 is used to compare the analog feedback from the resolver with the digital signal from the counter 22. Whenever one bit difference is detected at the translator 12 output, another count is accumulated into position counter 22. The position error detector, which is digital subtractor 62 and D/A converter 68, provides an output corresponding to the servo error signal. This signal which is available to be monitored is directly proportional to the difference between the command position $\phi'$ and the actual position $\phi$ of the resolver 30 shaft within a resolution of one bit. By observing this signal the status of the servo control can immediately be determined. This signal is extremely important in high speed phase lock or continuous path applications where the servo must follow rapidly changing commands, corresponding to instantaneous position or speed commands.

In addition to the inherent reliability gained by the use of resolver feedback signals, the absolute positioning servo systems 11 can also provide an infinite resolution feature, which is not obtainable in standard absolute digital type encoder positioning systems. This analog servo lock feature digital is achieved by switching the demodulated analog error signal $(\theta - \phi)$ from the digital encoder 10 to the servo controller 66 when the BCD subtractor 62 indicates 0 digital differential error. This feature can best be understood with reference to FIGS. 4 and 5. The disclosed invention allows the digital positioning system to incorporate the use of high accuracy digital data for the main portion of the range and then to incorporate a proportional infinite resolution analog signal over the least significant bit of travel. The demodulated error signal $(\theta - \phi)$ shown in FIG. 5 resembles a saw tooth profile 71 with the serations occurring with change in position rather than time. The width of each seration, of wave 71, is 1 LSB. Since the error signal $(\theta - \phi)$ is continuous within each seration the analog lock feature permits the disclosed servo positioning system 11 to lock onto its analog position signal within each least significant bit and achieve position accuracies of better than 1/5 LSB. This analog lock feature also allows the servo system to receive proportional torque around the center portion of the LSB, represented in FIG. 5 at 0°, thereby limiting the instability normally encountered with the conventional type of digital positioning equipment.

Figure 5:
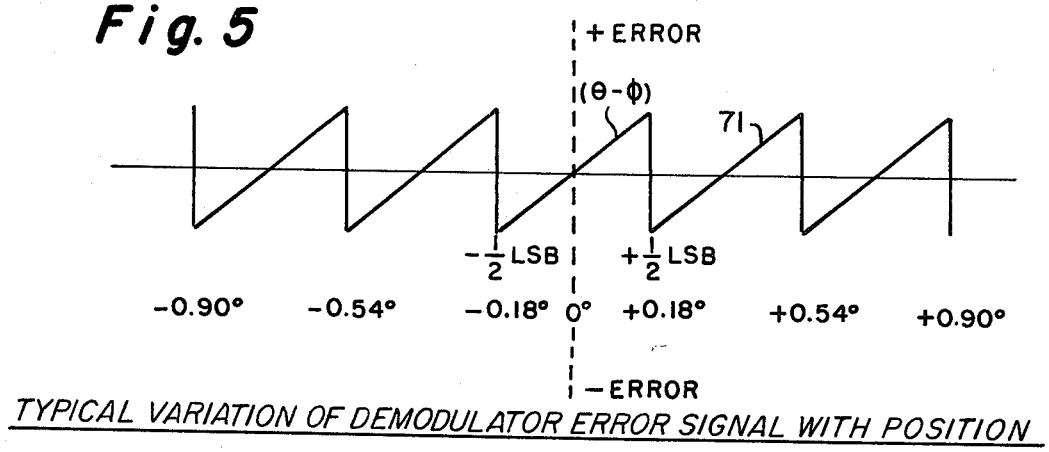
FIG. 5 is a graph showing the variation of the modulated error signal with respect to position.

The inherent advantages of the infinite resolution proportional feedback is best understood by considering a system having an error signal as shown in FIG. 5 with a resolution of .36° per bit. In order to achieve the accuracy of .36°, the prior art digital servo system must be designated such that full torque is available for position error of .36° or larger. Therefore, when the prior art positioning system reaches its null value the digital encoder cannot provide any feedback due to the quantization of the feedback signal over the LSB. That is, prior art positioning systems which use digital encoders coupled to the shaft to be controlled necessarily break the position of the shaft down into discrete intervals. Information about the position of the shaft within any discrete interval is not available in the prior art systems. The prior art system therefore will oscillate between 0 and 1 bit of position error and cause vibration of the equipment. This hunting and seeking can be eliminated with the control system as shown in FIGS. 3 and 4 which switches to an analog positioning system over the least significant bit of error. A proportional signal is generated over the least significant bit of travel allowing the servo system to lock precisely in the center of the least significant bit. The disclosed system 11 provides proportional torque as a function of position error to maintain the desired position. With this technique, positioning accuracies and resolutions of a fraction of the least significant bit can be obtained.

Another feature shown on the servo control system 11 of FIG. 4 is the short path positioning for the servo system 11. Whenever the BCD subtractor 62 indicates an absolute position error of more than 500, the short path position logic 70 senses this condition and inverts the analog error signal to the servo controller 66 resulting in the servo system 11 taking the shortest path for positioning. This feature is especially useful for an absolute servo positioning over 0° to 360°. Tachometer 80 is connected to the motor 58 for providing a feedback signal along line 81 to servo controller 66. This velocity feedback signal from tachometer 80 helps assure that servo controller 66 rapidly drives motor 58 in a controlled fashion to the desired position.

Exceptionally high band width is available in the tachometer feedback loop. This is accomplished since the motor 58 and tachometer 80 assembly is a single housed unit with the armature of the tachometer 80 and the motor 58 being physically as close as possible to each other. This close coupling eliminates any torsional resonance which would be introduced by coupling between the motor 58 armature and the tachometer 80 armature. In addition, the motor 58 is chosen to have extremely low armature inductance which further extends the usable servo band width. The servo controller 66 with the feedback from tachometer 80 utilizes nonlinear processing electronics to eliminate overshoot and to provide a controlled slewing rate for time optimized positioning. Since the disclosed servo system 11 is an absolute syste, large movement can be transversed very rapidly by simply commanding the end point. The motor 58 will then rotate at the selected slewing rate to the new position. Unlike some incremental systems, where the computer or command device must constantly update position information, the disclosed servo system 11 requires only the final position and it automatically moves to the new point. Square root generator 82, which feeds the error signal to servo controller 66, permits minimum positioning time for the servo system. The square root generator 82 and the servo controller 66 provide control during positioning of motor 58. This is accomplished by utilizing the output of the tachometer 80 which provides a signal proportional to speed as a control variable. As the new position is reached, square root generator 82 and servo controller 66 provide automatic controlled deceleration so as to reach the position with no overshoot. Adjustments can be made to achieve the maximum slewing velocity and deceleration consistent with the mass and inertia of the driven member.

The servo controller 66 comprises a high performance bipolar regenerative transistorized power amplifier and a preamplifier for providing the linear compensation and nonlinear stabilization networks. The low level DC input from the square root generator 82 to servo controller 66 is initially amplified by the preamplifier which also includes servo compensation circuitry. The output of the preamplifier is applied to a power amplifier which provides power and current amplification in order to drive the DC servo motor 58. The standard servo controller utilized in the disclosed servo system 11 provides a proportional output up to plus or minus 150 volts and plus or minus 35 amps depending on the controller required for the given applications. Regenerative control of the motor is provided within the power amplifier portion of servo controller 66. During deceleration the amplifier actually draws power from the motor 58 to provide for a rapid stop. Since the power amplifier utilized in servo controller 66 is an all transistor type the output power is smooth and free from pulsations normally found in SCR type amplifiers. In addition the smooth proportional power provided by the transistor amplifier reduces motor heating produced by corresponding SCR type amplifiers.

The motor actuator which comprises motor 58 and tachometer 80, employed in the controlled system 11, consists of a permanent magnet, high response servo motor 58 with the resolver 30 feedback assembly as an integral portion of the motor actuator. The tachometer 80 is usually included in the motor assembly. By virtue of the direct drive servo actuator approach, no power gear train is required. The disclosed system achieves a high level dynamic performance which is an order of magnitude better than the highest performance of a stepper motor or conventional closed loop servo system. Unlike stepper motor systems, the servo motors can operate with low or high inertia load without the risk of losing pulse or position reference.

It can thus be seen that the servo system 11 disclosed, provides for an absolute positioning system in response to the digital command input $\phi'$. The resolver 30 which is connected to the shaft feeds a signal $\theta$ to the tracking resolver to digital angle encoder 10, which provides a digital output signal $\phi$ indicating the position of the shaft within an accuracy of one bit. The digital position of the shaft $\phi$ is then compared with the digital command input position $\phi'$ and an error signal equaling the digital difference is provided by subtractor 62. This digital difference then goes through a digital to analog converter 68 and various other devices to be applied by servo controller 66 to control motor 58 which then rotates the shaft, to which is connected the shaft of resolver 30, to a position wherein the digital command signal $\phi'$ is equal to the digital position indicator $\phi$ from counter 22. At this point motor 58 has positioned resolver 30 within ±½LSB of the desired absolute position. At this point when $\phi = \phi'$, coarse positioning which is provided by the difference between $\phi$ and $\phi'$, is deactivated, and the fine positioning controlled by the difference between the exact position analog input $\theta$ and the digital input $\phi$, which at this point is equal to $\phi'$, is utilized for exact positioning of resolver 30 within a fraction of ½LSB. The difference between the analog feedback signal $\theta$ and the digital command input signal $\phi'$ is fed to analog lock 79 which feeds a signal to servo controller 66. The analog lock 79 then utilizes the continuous input of the error signal $(\theta - \phi)$ and activates servo controller 66 to move motor 58 to an exact position and hold this position, which is a fraction of the ½LSB. Thus it can be seen that the servo controller 66 utilizing the teaching of this invention can position the shaft at discrete positions which are repeatable and which can be held much closer than those obtainable with a normal digital shaft encoder.

What is claimed is:

1. A tracking digital angle encoder comprising:
   translator means for providing an analog output of the difference between an analog angle input and a digital angle input;
   detector means connected to the output of said translator to provide an output signal in response to the output of said translator, when the output of said translator exceeds a predetermined trigger level;
   counter means responsively connected to said detector and supplying the digital input to said translator;
   said detector means controlling said counter means so that the output of said translator is kept less than the predetermined trigger level;
   said detector means only activates said counter means when the output of said translator exceeds an absolute value; and
   adjustment means connected between said detector means and said counter means for adjusting the absolute value for which said detector means activates said counter means as a function of the output of said counter means.

2. A tracking digital angle encoder as claimed in claim 1 comprising:
   a resolver for providing the analog input to said translator;
   a reference oscillator connected to said resolver for providing a carrier function for the analog output of said resolver; and,
   said demodulator connected to the output of said translator and receiving an input from said reference oscillator for removing the carrier function from the suppressed carrier analog output of said translator.

3. A tracking digital angle encoder as claimed in claim 1 wherein:
   said translator analog input is in sine and cosine form and said translator output is in sine form, which is fed to said detector means, and cosine form; and
   the cosine output of said translator is connected to said counter for switching said counter to its midpoint when power is applied and the cosine value is negative.

4. A tracking digital angle encoder comprising:
   translator means for providing an analog output, in suppressed carrier form, of the difference between an analog angle input, in suppressed carrier trigonometric form, and a digital angle input;
   demodulator means connected to receive the output of said translator means and providing an output, in nonsuppressed carrier form, representing the difference between the analog angle input and the digital angle input to said translator;
   detector means connected to the output of said demodulator means to provide an output signal in response to the output of said demodulator means, when the output of said demodulator means exceeds a predetermined trigger level;
   counter means responsively connected to said detector and supplying the digital input to said translator;
   said detector means controlling said counter means so that the output of said translator is kept less than the predetermined trigger level;
   said detector means only activates said counter means when the output of said translator exceeds an absolute value; and
   adjustment means connected between said detector means and said counter means for adjusting the absolute value for which said detector means activates said counter means as a function of the output of said counter means.

5. A tracking digital angle encoder as claimed in claim 4 wherein said adjustment means comprises:
   digital to analog converter means connected to said counter means for supplying a signal related to the output of said counter means; and
   a function generator disposed between said digital to analog converter and the output of said translator to modify the output of said translator in accordance with any desired function.

6. A tracking digital angle encoder comprising:

translator means for providing an analog output, in suppressed carrier form, of the difference between an analog angle input, in suppressed carrier trigonometric form, and a digital angle input;

demodulator means connected to receive the output of said translator means and providing an output, in nonsuppressed carrier form, representing the difference between the analog angle input and the digital angle input to said translator;

detector means connected to the output of said demodulator means to provide an output signal in response to the output of said demodulator means, when the output of said demodulator means exceeds a predetermined trigger level;

counter means responsively connected to said detector and supplying the digital input to said translator;

said detector means controlling said counter means so that the output of said translator is kept less than the predetermined trigger level;

a resolver for providing the analog input to said translator;

a reference oscillator connected to said resolver for providing a carrier function for the analog output of said resolver;

said demodulator connected to the output of said translator and receiving an input from said reference oscillator for removing the carrier function from the suppressed carrier analog output of said translator; and modifying signal means disposed between said reference oscillator and said detector for modifying the trigger level of said detector to minimize the effect of unwanted signals which may be present on the output of the demodulator.

7. A tracking digital angle encoder as claimed in claim 6 comprising:
external signal means connected to the output of said translator for varying the output of said translator in accordance with a predetermined function.

8. A tracking digital angle encoder as claimed in claim 6 comprising:
signal varying means connected to the output of said translator for varying the output signal from said translator.

9. A tracking digital angle encoder as claimed in claim 6 comprising:
signal varying means connected to the output of said demodulator for varying the output signal from said demodulator.

10. A tracking digital angle encoder as claimed in claim 6 comprising:
signal varying means connected to said detector for varying the predetermined trigger level of said detector.

11. A tracking digital angle encoder as claimed in claim 6 comprising:
a clock providing digital pulses to said counter means when activated; and
clock frequency control means connected to said clock for controlling the frequency of said clock as a function of the analog angle input and the digital angle input.

12. A tracking digital angle encoder as claimed in claim 11 wherein:
said clock frequency control means operate said clock at a first frequency when the output of said translator is greater than a predetermined value and at a second frequency when the output of said translator is less than the predetermined value.

13. An encoder as claimed in claim 12 wherein said first frequency is greater than said second frequency.

14. A tracking digital angle encoder comprising:
translator means for providing an analog output, in suppressed carrier form, of the difference between an analog angle input, in suppressed carrier trigonometric form, and a digital angle input;

demodulator means connected to receive the output of said translator means and providing an output, in nonsuppressed carrier form, representing the difference between the analog angle input and the digital angle input to said translator;

detector means connected to the output of said demodulator means to provide an output signal in response to the output of said demodulator means, when the output of said demodulator means exceeds a predetermined trigger level;

counter means responsively connected to said detector and supplying the digital input to said translator;

said detector means controlling said counter means so that the output of said translator is kept less than the predetermined trigger level;

a resolver for providing the analog input to said translator;

a reference oscillator connected to said resolver for providing a carrier function for the analog output of said resolver;

said demodulator connected to the output of said translator and receiving an input from said reference oscillator for removing the carrier function from the suppressed carrier analog output of said translator; and rectifier means connected between said reference oscillator and said detector to vary the predetermined trigger level as a function of the amplitude of the output of said reference oscillator.

15. A tracking digital angle encoder comprising:
translator means providing an analog output signal, in suppressed carrier form, representing the difference between a digital input and an analog input;
a demodulator connected to the output of said translator means for removing the suppressed carrier from the analog output of said translator means;
detector means having a first output which is activated when the output of said demodulator exceeds a positive predetermined value and a second output which is activated when the output of said demodulator exceeds a negative predetermined value;
counter means connected to said detector means and feeding the digital input of said translator, said counter means constructed to count up or down and being connected to count so that the output of said translator is maintained within a band defined by the positive predetermined value and the negative predetermined value;
a resolver provides the analog input to said translator means which is in sine and cosine form;
said translator means provides an output in sine form to said detector; and
said translator means provides a cosine output connected to said counter to set said counter to a predetermined position with power applied and the cosine negative.

16. A tracking digital angle encoder as claimed in claim 15 comprising:
   clock means providing digital pulses of a preselected frequency;
   first gate means connected to the first output of said detector means;
   second gate means connected to the second output of said detector means;
   said counter means includes up and down inputs being connected so that when activated by pulses from said clock means passing through said first gate means or said second gate means said counter means counts to a position wherein the output of said translator is within a preselected range.

17. A tracking digital angle encoder as claimed in claim 16 comprising:
   clock frequency adjusting means connected to said clock means for adjusting the frequency of the digital clock pulses as a function of the analog angle input and the digital angle input.

18. A tracking digital angle encoder as claimed in claim 17 wherein:
   said clock frequency adjusting means controls said clock to provide digital pulses of a first greater frequency when the absolute value of the translator output exceeds a predetermined value and a second lesser frequency when the absolute value of the translator output is less than the predetermined value.

19. A tracking digital angle encoder as claimed in claim 15 including:
   varying means connected to said detector for varying the predetermined positive value and the predetermined negative value.

20. A tracking digital angle encoder as claimed in claim 15 comprising:
   signal varying means connected to vary the output signal of said translator in accordance with a preselected function.

21. A tracking digital angle encoder comprising:
   translator means for providing a trigonometric output in suppressed carrier form of the difference between a digital angular input and a suppressed-carrier trigonometric input;
   demodulating means connected to the output of said translator for removing the suppressed carrier from the output signal and providing a pure trigonometric output signal;
   threshold detecting means for determining when the output of said demodulator means exceeds a predetermined value;
   counter means, connected to be activated by said threshold detecting means, providing a digital input to said translator and being connected to provide a digital input for which the output of said demodulator means does not exceed the predetermined value; and
   presetting means connected between said translator and said counter means for setting said counter means, when power is initially applied, to a digital value separated by less than one half of the counter means range from the digital count equivalent of the trigonometric input.

22. A tracking digital angle encoder as claimed in claim 21 wherein:
   each count of said counter means corresponds to a predetermined angle; and
   adjusting means connected to said counter means for varying the value of the predetermined angle to which each count of the counter corresponds.

23. A tracking digital angle encoder as claimed in claim 21 comprising:
   a resolver for supplying a suppressed carrier trigonometric signal to said translator;
   a reference oscillator connected to said resolver providing the carrier; and
   rectifier means connected between said reference oscillator and said threshold detecting means for varying the predetermined value as a function of the reference oscillator amplitude.

24. A tracking digital angle encoder comprising:
   resolver means providing a suppressed carrier trigonometric output corresponding to an angular position of the resolver shaft;
   counter means responsive to an input providing a digital output corresponding to an angular position;
   translator means having inputs connected to said resolver means and said counter means and providing a suppressed carrier trigonometric signal proportional to the angular difference between the suppressed carrier trigonometric output of said resolver means and the digital output of said counter means;
   a demodulator connected to the output of said translator for demodulating the translator output and providing a trigonometric signal output representative of the angular difference between the inputs to said translator;
   feedback means connected to feed the input of said counter from the output of said demodulator to keep the output of said counter within a predetermined angular position of the output of said resolver means;
   the output of said translator means is in sine and cosine form; and
   power on positioning means connected to the cosine output of said translator and said counter for initiating switching said counter to its approximate midpoint position when power is applied and the value of the cosine is negative.

25. A digital angle encoder comprising:
   resolver means providing a suppressed carrier trigonometric output corresponding to an angular position of the resolver shaft;
   counter means responsive to an input providing a digital output corresponding to an angular position;
   translator means having inputs connected to said resolver means and said counter means and providing a suppressed carrier trigonometric signal proportional to the angular difference between the suppressed carrier trigonometric output of said resolver means and the digital output of said counter means;
   a demodulator connected to the output of said translator for demodulating the translator output and providing a trigonometric signal output representative of the angular difference between the inputs to said translator;
   feedback means connected to feed the input of said counter from the output of said demodulator to keep the output of said counter within a predetermined angular position of the output of said resolver means;
   each count of said counter means corresponds to a known angle; and adjusting means connected to said counter means for adjusting the value of the known angle to which each count of said counter means corresponds.

26. A digital angle encoder comprising:

resolver means providing a suppressed carrier trigonometric output corresponding to an angular position of the resolver shaft;

counter means responsive to an input providing a digital output corresponding to an angular position;

translator means having inputs connected to said resolver means and said counter means and providing a suppressed carrier trigonometric signal proportional to the angular difference between the suppressed carrier trigonometric output of said resolver means and the digital output of said counter means;

a demodulator connected to the output of said translator for demodulating the translator output and providing a trigonometric signal output representative of the angular difference between the inputs to said translator;

feedback means connected to feed the input of said counter from the output of said demodulator to keep the output of said counter within a predetermined angular position of the output of said resolver means; and prepositioning means which switches said counter means to the vicinity of its midpoint when the midpoint is closer than the zero point to the desired digital position when power is applied.

* * * * *